(12) United States Patent
Itoh

(10) Patent No.: US 6,288,407 B1
(45) Date of Patent: *Sep. 11, 2001

(54) ELECTRON BEAM-WRITING APPARATUS AND ELECTRON BEAM-WRITING METHOD

(75) Inventor: Katsuyuki Itoh, Tokyo (JP)

(73) Assignee: NEC Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/918,165

(22) Filed: Aug. 25, 1997

(30) Foreign Application Priority Data

Aug. 30, 1996 (JP) .................................... 8-230370

(51) Int. Cl.⁷ .................................................. H01L 21/027
(52) U.S. Cl. ......................................................... 250/492.23
(58) Field of Search .............................. 250/492.23, 492.2

(56) References Cited

U.S. PATENT DOCUMENTS

| | | | | |
|---|---|---|---|---|
| 4,167,676 | * | 9/1979 | Collier | 250/492.23 |
| 5,334,282 | * | 8/1994 | Nakayama et al. | 250/492.23 |
| 5,468,969 | * | 11/1995 | Itoh et al. | 250/492.23 |
| 5,868,952 | * | 2/1999 | Hatakeyama et al. | 216/66 |

FOREIGN PATENT DOCUMENTS

| | | | |
|---|---|---|---|
| 5429981 | 3/1979 | (JP) | H01L/21/36 |
| 3-64016 | 3/1991 | (JP) | H01L/21/027 |
| 4-65818 | 3/1992 | (JP) | H01L/21/30 |
| 6-151290 | 5/1994 | (JP) | H01L/21/027 |
| 7-211626 | 8/1995 | (JP) | H01L/21/027 |

OTHER PUBLICATIONS

"Highly accurate calibration method of electron–beam cell projection lithography" Nakayama et al SPIE vol. 1924; (1993) pp. 183–192.

"Electron–beam cell projectionlithography: Its accuracy and its throughput" Someda et al J. Vac. Sci. Technol. B 12(6), Nov./Dec. 1994; pp. 3399–3403.

* cited by examiner

*Primary Examiner*—Jack Berman
(74) *Attorney, Agent, or Firm*—Hayes, Soloway, Hennessey, Grossman & Hage, P.C.

(57) ABSTRACT

An electron beam-writing apparatus comprising a first beam-shaping aperture means and a second beam-shaping aperture means, wherein the first and/or second beam-shaping aperture means has an aperture(s) of a shape(s) corresponding to the desired patterns to be written on a semiconductor substrate; and an electron beam-writing method of improved throughput using the apparatus.

6 Claims, 9 Drawing Sheets

ELECTRON BEAM-WRITING APPARATUS AND ELECTRON BEAM-WRITING METHOD

BACKGROUND OF THE INVENTION

1. Field of the Invention

The present invention relates to an electron beam-writing apparatus capable of writing a plurality of desired patterns on a semiconductor substrate in one shot, as well as to an electron beam-writing method using the apparatus.

2. Description of the Prior Art

With the ever improving fineness of semiconductor devices in recent years, the lithography technology used in production of semiconductor devices is changing from light exposure to electron beam writing (electron beam exposure). Electron beam writing can provide high resolution but has a problem of low throughput. To solve the low-throughput problem, there were developed a method described in Japanese Patent Application Laid-Open (Kokai) No. 54-29981 and methods called one-shot exposure method, block-by-block exposure method or part-by-part exposure method. In one of these conventional methods, an electron beam emitted from an electron gun is shaped into a square beam by a first aperture means; the square beam is applied onto a second aperture means (a transfer mask) having desired patterns formed therein; an electron beam of desired patterns which has passed through the second aperture means, is applied onto a semiconductor wafer for writing (transferring). A representative apparatus used in this method is schematically explained with reference to FIG. 1. An electron beam 3 emitted from an electron beam source 2 is shaped by a first beam-shaping aperture means 4 and a second beam-shaping aperture means 8 and is applied onto a sample 9 placed on a sample stage 10. The electron beam 3 emitted from the electron beam source 2 has a Gaussian distribution (that is, has a nearly circular section) and, as shown in FIG. 10, the aperture 102 of the first beam-shaping aperture means 100 has a square shape in order to effectively utilize an electron beam-applied area 101.

When, by using a first beam-shaping aperture means 100 shown in FIG. 10, cell patterns 40 of memory device are formed on a sample (a semiconductor wafer) 9, as shown in FIG. 4, by part-by-part exposure method and in that case, there is used a maximum writing area 110 (see FIG. 11) formed on the first beam-shaping aperture means 100, for achieving high throughput, the patterns 112 on a second beam-shaping aperture means consist of, for example, 7 patterns in X direction and 3 patterns in Y direction as shown in FIG. 11. By repeatedly writing this unit block on the wafer, cell patterns 40 of memory device as shown in FIG. 4 are formed. The number of cell patterns of memory device is ordinarily $2^n$. However, when the cell patterns 40 are formed by repeated writing of a unit block consisting of 7 patterns in X direction and 3 patterns in Y direction, the number of cell patterns formed is not $2^n$ and there appears pattern shortage or pattern excess at the last row and column. To remedy this problem, therefore, it is necessary that part-by-part writing is conducted up to the row and column right before the last row and column and that variable shaping writing is conducted for the last row and column. In this approach, there are required, in addition to the pattern shot data for part-by-part writing, data preparation for variable shaping writing, data planning, and position matching between part-by-part writing and variable shaping writing, etc., resulting in increased operational steps and increased time. To reduce steps required for data preparation for variable shaping writing, data planning, and position matching between part-by-part writing and variable shaping writing, etc., it is necessary that the number of patterns in the unit block used in conducting writing is a number satisfying $2^n$ as in an example of a block 111 (shown in FIG. 11) consisting of 4 patterns in X direction and 2 patterns in Y direction.

As stated above, when writing is conducted using a maximum square writing area 110 as shown in FIG. 11, 21 patterns [7 patterns (in X direction)×3 patterns (in Y direction)] can be written and satisfactory writing throughput is obtained. However, in view of the steps required for data preparation, position matching, etc., the actual writing throughput is low.

When each pattern of device has a shape long in X direction and short in Y direction as shown in FIG. 12 (120 is a maximum writing area), the unit block 121 of patterns 122, formed on a second beam-shaping aperture means must have a rectangular shape (long in X direction and short in Y direction) in order for the number of patterns in the unit block to be $2^n$ ($2^2=4$ in FIG. 12). If the unit block has a square shape, the writing area is inevitably insufficient in X direction and inevitably excessive in Y direction. Similarly, when each pattern of device has a shape short in X direction and long in Y direction as shown in FIG. 13 (130 is a maximum writing area), the unit block 131 of patterns 132, formed on a second beam-shaping aperture means must have a rectangular shape (short in X direction and long in Y direction) in order for the number of patterns in the unit block to be $2^n$ ($2^2=4$ in FIG. 13). If the unit block has a square shape, the writing area is inevitably insufficient in Y direction and inevitably excessive in X direction. While reduction in steps required for data preparation, position matching, etc. is desired, the reduction is achieved by using the square block 121 or 131 and increasing the number of shots. In the case of FIG. 14 described in Japanese Patent Application Laid-Open (Kokai) No. 3-64016, one pair of patterns is long in X direction and, therefore, the number of patterns in X direction is small when a square maximum writing area is used. As a result, the unit writing block is inevitably rectangular (X>Y). In this type of writing, however, two shots are required in order to form one pair of patterns, resulting in even lower throughput.

In a conventional electron beam-writing apparatus as shown in FIG. 1, the first beam-shaping aperture means has, as shown in FIG. 10, a square aperture in order to effectively utilize an electron beam-applied area 101 (having a circular shape owing to the Gaussian distribution of the electron beam applied). When the pattern formation of memory device is conducted by part-by-part writing method (or one-shot writing method), the number of patterns in unit block is $2^n$ in order to reduce the steps required for pattern data preparation, position matching between part-by-part writing area and variable shaping writing area, etc. When one shot is allowed to include a plurality of unit blocks each having $2^n$ patterns (examples of the unit block are shown in FIGS. 11, 12, 13 and 14), the writing area is slightly insufficient in Y direction in FIG. 11 or FIG. 13 and in X direction in FIG. 12 or FIG. 14. Therefore, allowing one shot to include a plurality of small unit blocks has been difficult. This has allowed one shot to include only one unit block, making it impossible to achieve high writing throughput. Further, in patterns as shown in FIG. 14, since there are supplementary patterns in X direction, the number of patterns in Y direction is small as compared with the number of patterns in X direction, making it impossible to achieve high throughput.

SUMMARY OF THE INVENTION

The object of the present invention is to provide an electron beam-writing apparatus which can optimize the writing area and thereby can promise high throughput, and an electron beam-writing method using the apparatus.

The object of the present invention can be achieved by an electron beam-writing apparatus comprising a first beam-shaping aperture means having at least one aperture for shaping an electron beam and a second beam-shaping aperture means having at least one aperture for further shaping the electron beam shaped by the first aperture means, and thereby capable of writing desired patterns, wherein the first and/or second beam-shaping aperture means has an apertures of shape(s) corresponding to the desired patterns to be written.

The object of the present invention can also be achieved by an electron beam-writing method which comprises (1) shaping an electron beam by the use of a first beam-shaping aperture means having at least one aperture and (2) further shaping the electron beam shaped by the first aperture means, by the use of a second beam-shaping aperture means having at least one aperture, to write desired patterns, wherein the first and/or second beam-shaping aperture means has an aperture(s) of shape(s) corresponding to the desired patterns to be written.

In the electron beam-writing apparatus of the present invention, the aperture shape of the first beam-shaping aperture means is not square and is allowed to correspond to the device produced, or allowed to correspond to the shape of the unit block of patterns, formed in the aperture of the second beam-shaping aperture means. When the device produced is, for example, short in X direction and long in Y direction, the unit block of patterns, formed in the second beam-shaping aperture must be short in X direction and long in Y direction; therefore, the proportions of X and Y in the first beam-shaping aperture is made X<Y. Further, the stage for the first beam-shaping aperture is made movable and its movement is controlled by a signal inputted from outside.

In the present electron beam-writing apparatus, the shape of the aperture of the first beam-shaping aperture means is allowed to correspond to the shape of the aperture of the second beam-shaping aperture means, whereby the shape of the electron beam-applied area is changed effectively. Therefore, while in FIG. 11, 12, 13 or 14, part of patterns 112, 122, 132 or 140 is not included in the conventional square maximum writing area 110, 120, 130 or the like, one-shot writing of about two unit blocks is possible in the present invention and no pattern is excluded from the maximum writing area.

In the present invention, an electron beam is effectively utilized in a circular beam-applied area, whereby increased throughput is obtained. Increased throughput results in productivity increase and cost reduction. Further, for example, the stage for the first beam-shaping aperture means is a high-accuracy stage controllable from outside, such as X-Y stage, X-Y-Z stage, rotatable stage or the like, whereby aperture selection from a plurality of apertures of the first beam-shaping aperture means is easily made.

DESCRIPTION OF THE PREFERRED EMBODIMENTS

Figure 1:
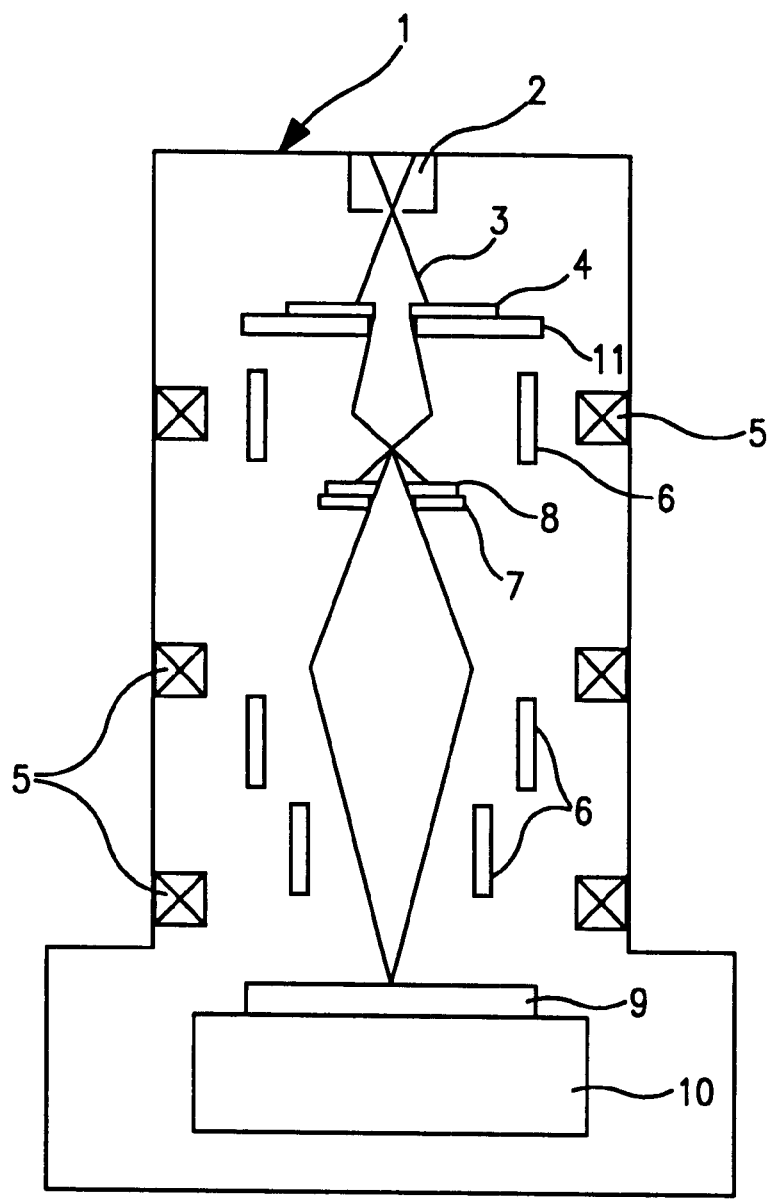
FIG. 1 is a schematic drawing of a first embodiment of the electron beam-writing apparatus according to the present invention or a conventional technique.
Figure 2:
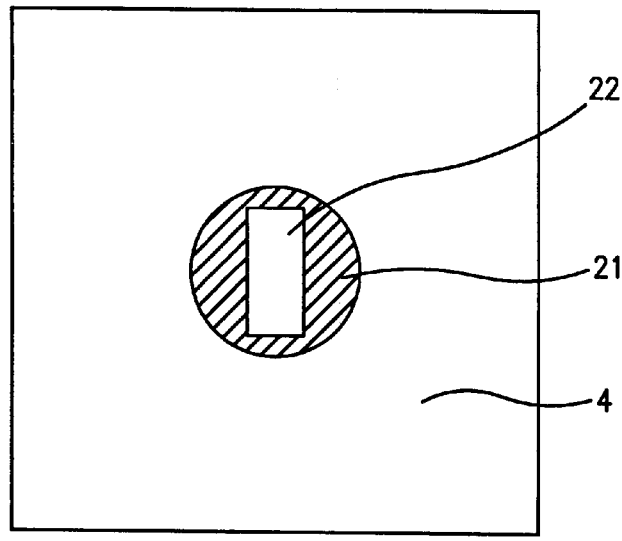
FIG. 2 is a plane view showing a first embodiment of the first beam-shaping aperture means of the present invention.
Figure 3:
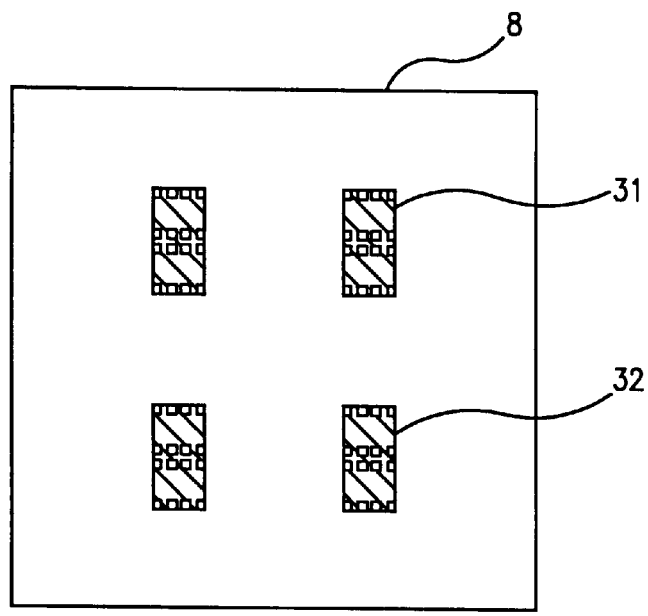
FIG. 3 is a plane view showing a first embodiment of the second beam-shaping aperture means of the present invention.

The present invention is explained with reference to related drawings. FIG. 1 is a schematic drawing of an electron beam-writing apparatus 1 which is a first embodiment of the present invention. Inside the apparatus 1 is an electron beam source 2. An electron beam 3 emitted therefrom is applied onto a first beam-shaping aperture means 4 placed on a stage 11. Below the stage 11 are provided a beam-shaping lens 5 and a beam deflector 6. Below them is a second beam-shaping aperture means 8 placed on a stage 7. Further below are beam-shaping lenses 5 and beam deflectors 6. A shaped electron beam is applied onto a sample 9 placed on a sample stage 10, in a size smaller than the beam size on the second beam-shaping aperture means 8, whereby writing is made on the sample 9. Shown in FIG. 2 is a plane view showing the surface state of the first beam-shaping aperture means 4; and shown in FIG. 3 is a plane view showing the surface state of the second beam-shaping aperture means 8. In the apparatus 1 are used, in combination, the first beam-shaping aperture means 4 shown in FIG. 2 and the second beam-shaping aperture means 8 shown in FIG. 3.

Figure 4:
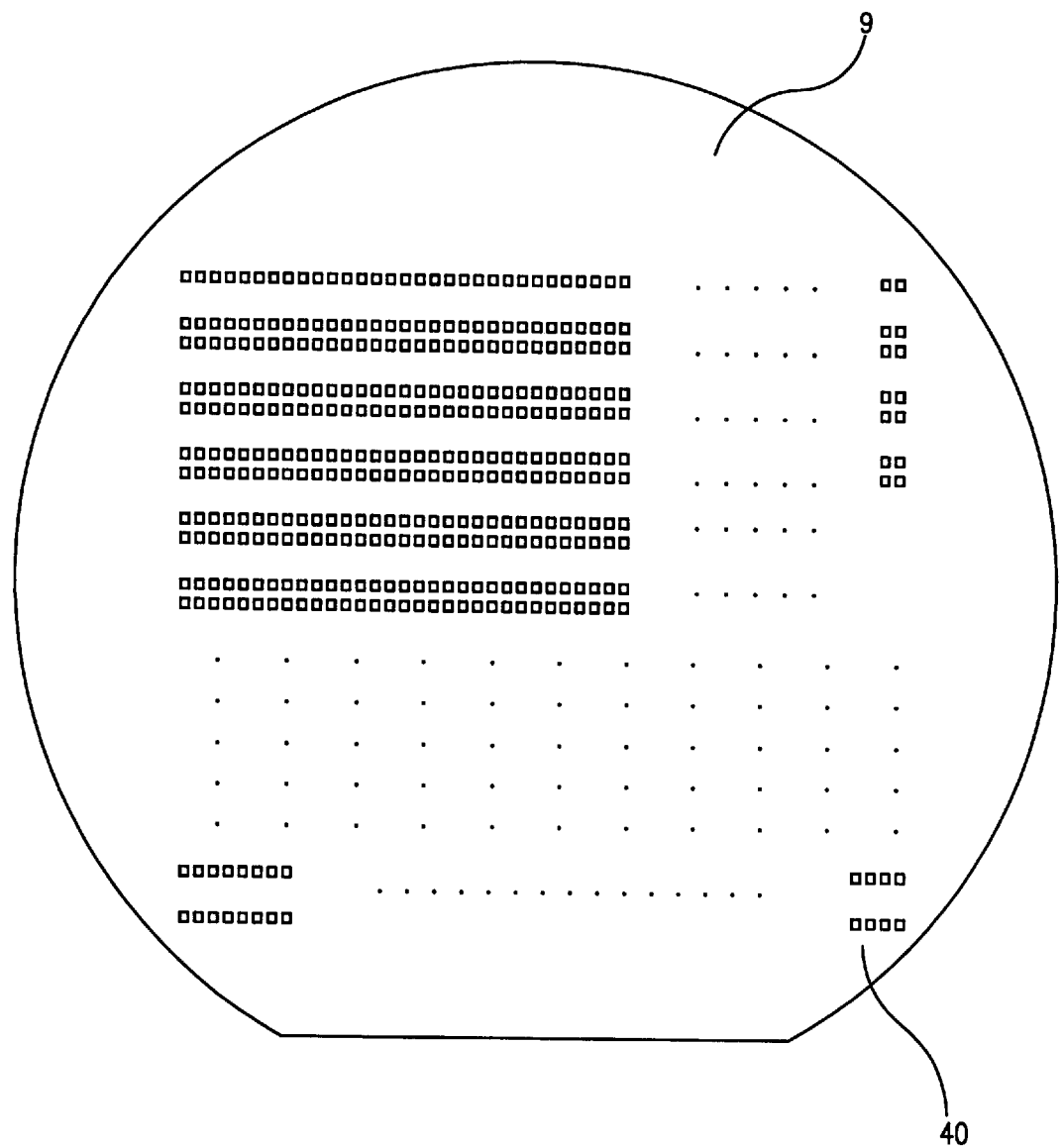
FIG. 4 is a plane view of the patterns formed on a semiconductor substrate according to the present invention or a conventional technique.

Next, the operation of the first embodiment is explained with reference to related drawings. As shown in FIG. 1, inside the electron beam-writing apparatus 1 is an electron beam source 2. An electron beam 3 emitted therefrom is spread in a Gaussian distribution. The spread beam 3 is applied, in an almost circular shape, onto a beam-applied area 21 of a first beam-shaping aperture means 4, as shown in FIG. 2 and is shaped into a rectangular shape (X<Y) by an aperture 22 of the first beam-shaping aperture means 4. The shaped beam is then passed through a beam-shaping lens 5 and a beam deflector 6 and applied, in a rectangular shape (X<Y), onto a second beam-shaping aperture means 8, as shown in FIG. 3 (31 is a beam-effective area). The beam is shaped, by the second beam-shaping aperture means 8, into a shape of the patterns 32 of the second beam-shaping aperture means 8. The shaped beam is passed through beam-shaping lenses 5 and beam deflectors 6 and transferred onto a sample (a semiconductor substrate) 9 placed on a sample stage 10, in a size smaller than the beam size on the second beam-shaping aperture means 8. This transferring is repeated while the sample 9 is being moved in X and Y directions by the use of a sample stage 10, whereby memory cell patterns 40 as shown in FIG. 4 are formed on the sample 9. In this embodiment, the patterns of the second beam-shaping aperture means 8 are part of the memory cell patterns shown in FIG. 4. Since all the memory cell patterns are formed part-by-part writing method, the number of patterns of unit block (one shot) is $2^4$ (16). That is, by repeating a unit block consisting of 16 patterns, total memory cell patterns are written.

Figure 11:
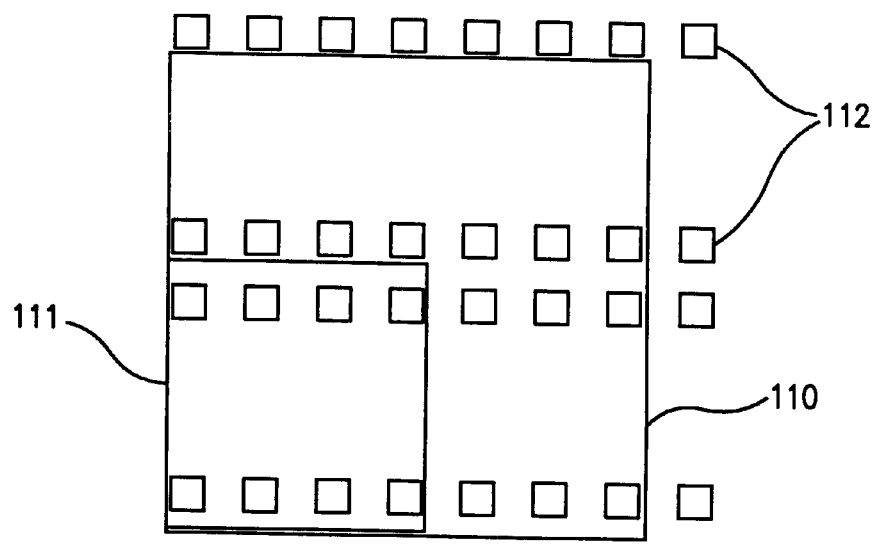
FIG. 11 is a plane view for explaining first and second beam-shaping aperture means according to a conventional technique.
Figure 12:
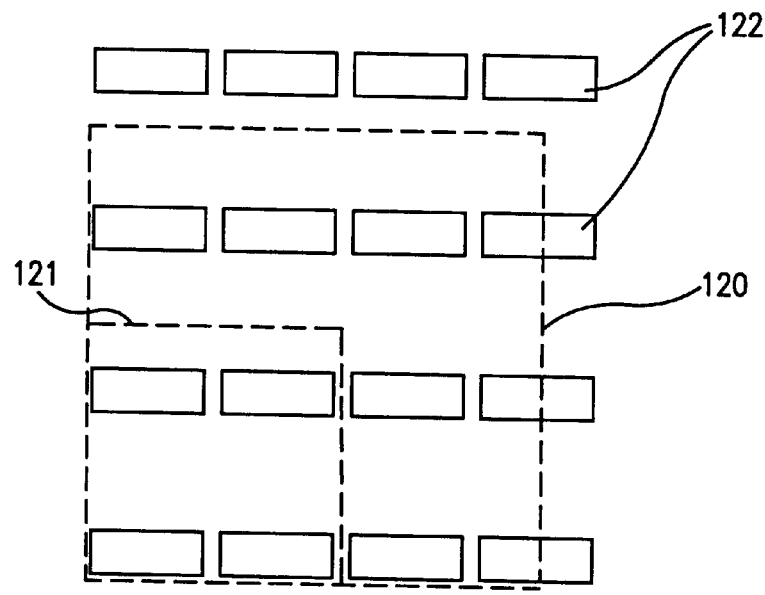
FIG. 12 is a plane view for explaining first and second beam-shaping aperture means according to a conventional technique.
Figure 13:
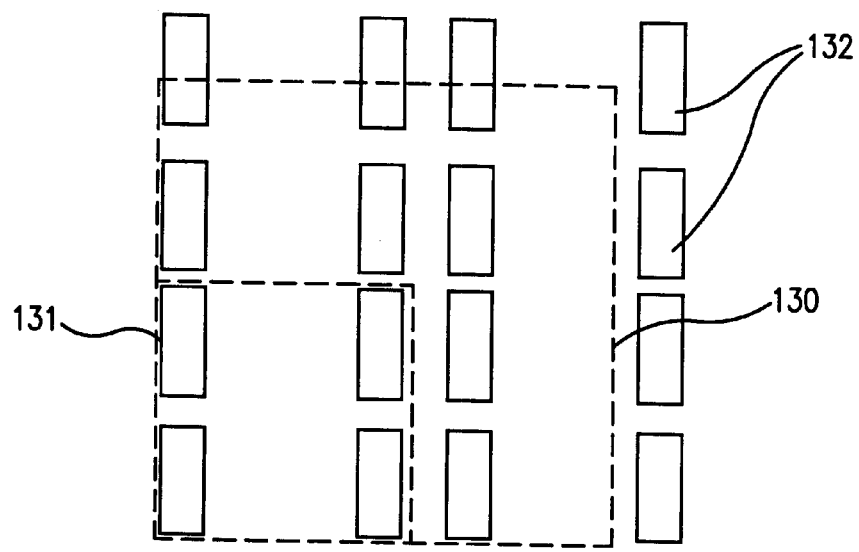
FIG. 13 is a plane view for explaining first and second beam-shaping aperture means according to a conventional technique.
Figure 14:
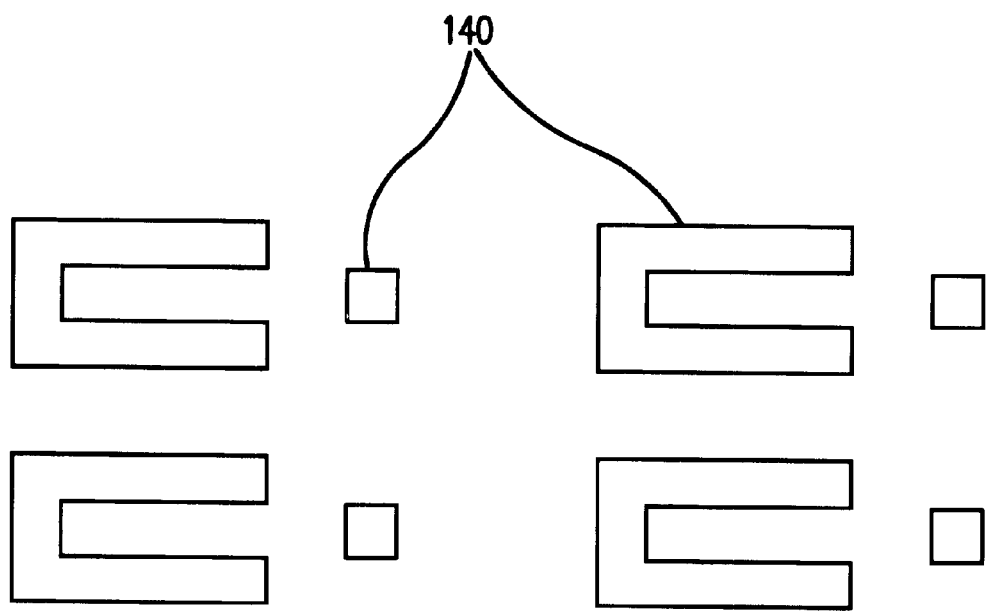
FIG. 14 is a plane view for explaining a second beam-shaping aperture means according to a conventional technique.

Thus, in the present embodiment, the shape of the first beam-shaping aperture means is produced so as to correspond to the shape of the second beam-shaping aperture means. Therefore, while in FIG. 11, 12 or 13, part of patterns 112, 122 or 132 is not included in the conventional square maximum writing area 110, 120 or 130, one-shot writing of about two unit blocks is possible in the present embodiment and no pattern is excluded from the maximum writing area. This leads to increased throughput.

Figure 5:
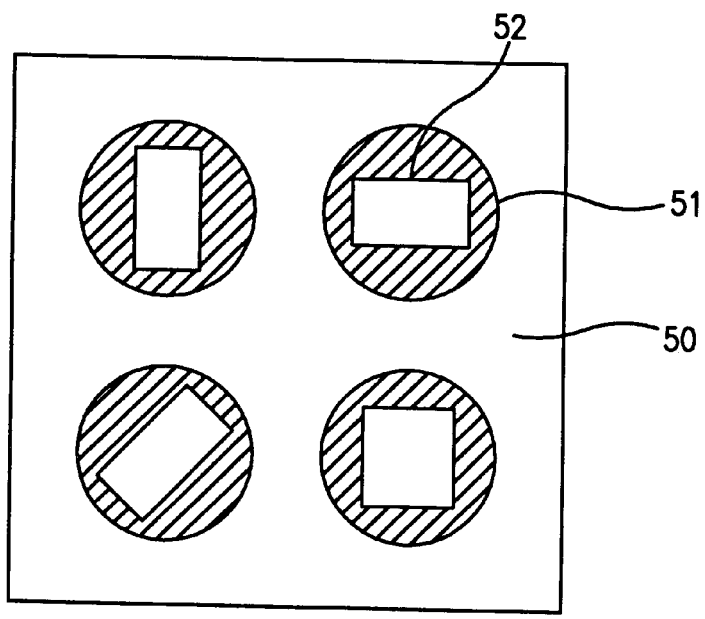
FIG. 5 is a plane view showing a second embodiment of the first beam-shaping aperture means of the present invention.
Figure 6:
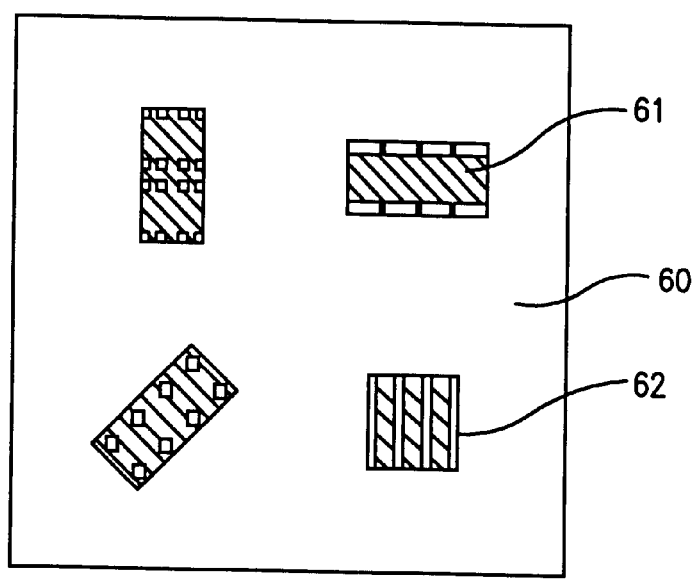
FIG. 6 is a plane view showing a second embodiment of the second beam-shaping aperture means of the present invention.

Next, the second embodiment of the present invention is explained with reference to FIG. 5 and FIG. 6. FIG. 5 is a plane view showing the surface state of a first beam-shaping aperture means; and FIG. 6 is a plane view showing the surface state of a second beam-shaping aperture means. In the second beam-shaping aperture means 60 of FIG. 6 are shown four kinds of blocks each consisting of respective patterns. In the first beam-shaping aperture means 50 of FIG. 5 are formed four different apertures 52, i.e. a rectangular aperture (X<Y), a rectangular aperture (X>Y), an obliquely rectangular aperture and a square aperture so as to correspond to the four different blocks of the second beam-shaping apertures. When writing is made on a sample, one aperture of the first beam-shaping aperture means of FIG. 5 is selected so as to correspond to one block (whose patterns are to be written on the sample) of the second beam-shaping aperture means of FIG. 6, and the two apertures are used in combination.

Figure 7:
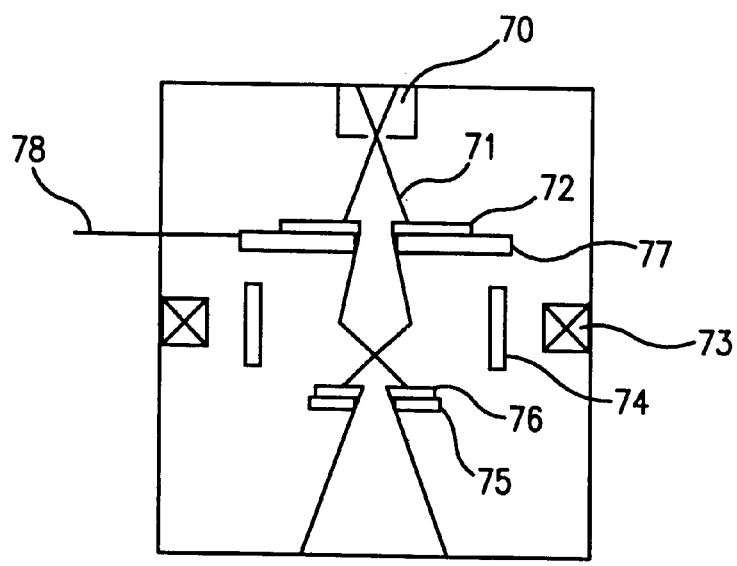
FIG. 7 is a sectional view showing part of a second embodiment of the electron beam-writing apparatus according to the present invention.
Figure 8:
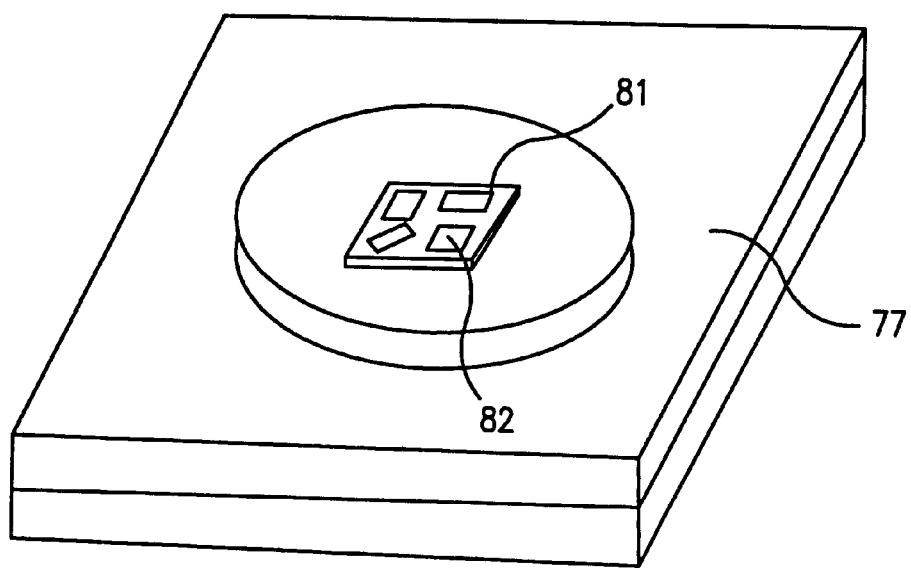
FIG. 8 is a perspective view showing an embodiment of the stage for first beam-shaping aperture means of the present invention.
Figure 9:
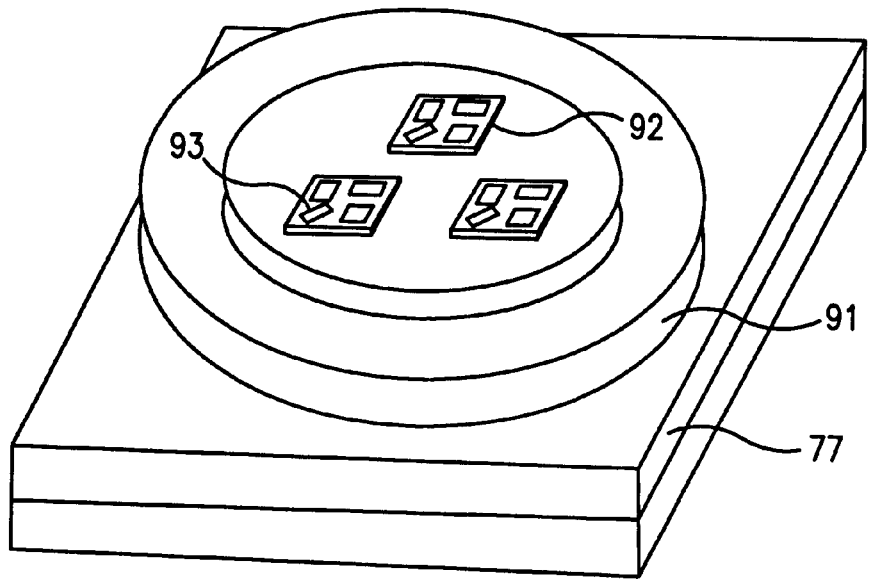
FIG. 9 is a perspective view showing other embodiment of the stage for first beam-shaping aperture means of the present invention.
Figure 10:
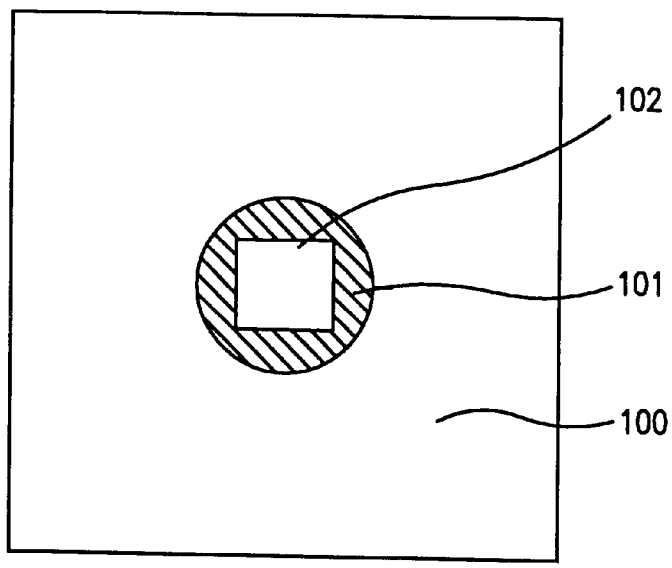
FIG. 10 is a plane view for explaining a first beam-shaping aperture means according to a conventional technique.

The first beam-shaping aperture means 50 shown in FIG. 5 has a plurality of kinds (four kinds in FIG. 5) of apertures 52 (51 is each beam-effective area). One aperture 52 must be selected so as to correspond to one block (whose patterns are to be written on a sample) of the second beam-shaping aperture means of FIG. 6. FIG. 7 is a schematic drawing of an electron beam-writing apparatus which enables such selection of one aperture 52. In FIG. 7, however, is shown only a portion of the apparatus including stages 77 and 75 for first and second beam-shaping aperture means 72 and 70, and the other portion of the apparatus is the same as in the electron beam-writing apparatus of FIG. 1. That is, the apparatus of FIG. 7 comprises an electron beam source 70, a first beam-shaping aperture means 72 for shaping an electron beam 71, a beam-shaping lens 73, a beam deflector 74 and a second beam-shaping aperture means 76. In the electron beam-writing apparatus of FIG. 7, the stage 77 for the first beam-shaping aperture means 72 is movable by an electric signal sent from an external control system via a line 78 connected to the control system. FIG. 8 is a perspective view showing a specific structure of the stage 77 for first beam-shaping aperture means, wherein a first beam-shaping aperture means 81 is provided on a stage 77 movable in X and Y directions. By moving the stage 77 so as to correspond to one block (whose patterns are to be written) of the second beam-shaping aperture means shown in FIG. 6, one aperture 82 of the first beam-shaping aperture means 81 is selected. The movement of the stage 77 is conducted via the line 78 connected to the external control system. FIG. 9 shows other embodiment of the stage 77 for first beam-shaping aperture means. In FIG. 9, a rotary stage 91 is provided on an XY stage 77 so that one of a plurality of kinds of first beam-shaping aperture means 92 and one of a plurality of kinds of apertures 93 can both be selected. In the above explanation, a stage movable only in X and Y directions was mentioned, but a stage movable in Z direction can be used additionally. In this embodiment, since a plurality of kinds of device patterns can be formed by using one sheet of beam-shaping aperture means, no time is taken for change of beam-shaping aperture means.

What is claimed is:

1. An electron beam-writing method which comprises (1) shaping a substantially circular electron beam by the use of a first beam-shaping aperture means having a plurality of rectangular (x<y) apertures in a pattern corresponding to a desired pattern to be written, and (2) further shaping the electron beam shaped by the first beam-shaping aperture means, by the use of a second beam-shaping aperture means, to write desired patterns, wherein said second beam-shaping aperture means comprises a plurality of beam-shaping apertures arranged in block patterns having rectangular shapes corresponding in shape and pattern to that of said first beam-shaping aperture means, and wherein each beam-shaping aperture block pattern in the second beam-shaping aperture means comprises a whole number multiple of apertures as compared to the first beam-shaping aperture means and said whole number multiple of apertures are arranged into a desired pattern shape whereby to divide said beam into a plurality of cells.

2. An electron beam-writing method according to claim 1, wherein the first beam-shaping aperture means has a plurality of apertures of different shape, and including the step of selecting one of these apertures by an external control means.

3. An electron beam-writing method according to claim 2, wherein the first beam-shaping aperture means comprises a stage, movable in X, Y and Z directions, and including the step of moving the stage to select any one of the apertures of the first beam-shaping aperture means.

4. An electron beam-writing method according to claim 1, wherein the patterned aperture(s) of the second beam-shaping aperture means have a rectangular beam-applied area, and the rectangular beam-applied area has a block pattern arranged in a matrix of $2^n$ (where n is a natural number) in the X and Y directions, respectively; and, wherein the apertures(s) of the first beam-shaping aperture means have rectangular shapes such that the shaped beam is applied on the device patterns arranged in the matrix of $2^n$ (where n is a natural number) in the X and Y directions, respectively.

5. An electron beam-writing method according to claim 1, wherein the first beam-shaping aperture means comprises at least two rectangular apertures, each of which is angled relative to the other.

6. An electron beam-writing method according to claim 1, wherein a first beam-shaping lens is operatively disposed between the first beam-shaping aperture means and the second beam-shaping aperture means, the sample is held on a sample stage; and a second beam-shaping lens is operatively disposed between the second beam-shaping aperture means and the sample stage.

* * * * *